(12) United States Patent
Han et al.

(10) Patent No.: US 8,174,903 B2
(45) Date of Patent: May 8, 2012

(54) METHOD OF OPERATING NONVOLATILE MEMORY DEVICE

(75) Inventors: Jung Chul Han, Gyeonggi-do (KR); Seong Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 162 days.

(21) Appl. No.: 12/790,191

(22) Filed: May 28, 2010

(65) Prior Publication Data
US 2010/0302868 A1    Dec. 2, 2010

(30) Foreign Application Priority Data

May 29, 2009    (KR) ........................ 10-2009-0047823

(51) Int. Cl.
*G11C 11/34* (2006.01)
*G11C 16/06* (2006.01)
(52) U.S. Cl. .............................. 365/185.25; 365/185.22
(58) Field of Classification Search ............. 365/185.25, 365/185.22, 185.17
See application file for complete search history.

(56) References Cited

U.S. PATENT DOCUMENTS

| 5,671,186 A * | 9/1997 | Igura .............................. 365/203 |
| 6,175,523 B1 * | 1/2001 | Yang et al. ............... 365/185.25 |
| 7,529,145 B2 * | 5/2009 | La Rosa et al. ............... 365/203 |
| 2009/0296471 A1 * | 12/2009 | Goda et al. ............... 365/185.11 |

FOREIGN PATENT DOCUMENTS

KR    1020090002470    1/2009

OTHER PUBLICATIONS

Notice of Allowance issued from Korean Intellectual Property Office on Feb. 7, 2011.

* cited by examiner

*Primary Examiner* — Anh Phung
(74) *Attorney, Agent, or Firm* — IP & T Group LLP (57) ABSTRACT

A method of operating a nonvolatile memory device, including a memory cell array, which further includes a drain select transistor, a memory cell string, and a source select transistor coupled between a bit line and a source line, where the method includes precharging the bit line, setting the memory cell string in a ground voltage state, coupling the memory cell string and the bit line together and supplying a read voltage or a verification voltage to a selected memory cell of the memory cell string, and coupling the memory cell string and the source line together in order to change a voltage level of the bit line in response to a threshold voltage of the selected memory cell.

19 Claims, 5 Drawing Sheets

METHOD OF OPERATING NONVOLATILE MEMORY DEVICE

CROSS-REFERENCE TO RELATED APPLICATION

Priority to Korean patent application number 10-2009-0047823 filed on May 29, 2009, the entire disclosure of which is incorporated by reference herein, is claimed.

BACKGROUND

Exemplary embodiments relate to a method of operating a nonvolatile memory device.

In recent years, there has been an increasing demand for nonvolatile memory devices which can be electrically programmed and erased, and which do not require the refresh function of rewriting data at specific intervals.

A read operation and a verification operation of the nonvolatile memory device are performed in a similar way. First, in the state in which a bit line coupled to a selected memory cell to be read is precharged to a high voltage level, a reference voltage is supplied to a word line coupled to the selected memory cell, and the remaining unselected memory cells are maintained in a turn-on state. If the selected memory cell has a threshold voltage having the reference voltage or more, it is in a turn-off state, and so the voltage level of the bit line is not changed. However, if the selected memory cell has a threshold voltage less than the reference voltage, it is in a turn-on state, and the voltage of the bit line is discharged through a common source line in a ground voltage state. Moreover, whether a memory cell to be read has a threshold voltage having a reference voltage or more can be determined based on a shift in the voltage level of a bit line.

According to the read operation or the verification operation described above, if a memory cell, coupled to an unselected bit line, from among memory cells to which read and verification reference voltages are supplied, has a threshold voltage having the reference voltage or more, the corresponding memory cell is turned off, and so two channels with different electrical properties are formed on the basis of the corresponding memory cell. Thus, a voltage of a channel, which is formed in memory cells coupled to a variable voltage terminal of a ground voltage state, is maintained at 0 V. However, a channel of memory cells, coupled between a memory cell of a turned-off state and a source select transistor of a turned-off state, is in a floating state. Accordingly, there is a possibility that threshold voltages of the corresponding memory cells may rise because of voltage supplied to their gates.

A high pass voltage is supplied to the gates of the memory cells. Thus, charges can move to the floating gates of the memory cells because of a hot carrier injection (HCI) phenomenon, leading to a rise in the threshold voltages of the memory cells. In particular, in the case in which the memory cells are in an erase state, such a phenomenon may become worse. Such a phenomenon is referred to as disturbance occurring during the read or verification operation.

The disturbance phenomenon occurring during the read or verification operation results in a change in the voltage level of the bit line. Accordingly, there may be a problem in that the memory cell is measured as having been programmed with a threshold voltage that is less than a target threshold voltage, when in actuality it has been programmed with a threshold voltage that is more than the target threshold voltage. In particular, in the verification operation, an over-program problem (i.e., where a memory cell is programmed with a threshold voltage higher than a target voltage) or an under-program problem (i.e., where a memory cell is programmed with a threshold voltage less than a target voltage) can occur because of the erroneous measurement.

BRIEF SUMMARY

Exemplary embodiments relate to a method of operating a nonvolatile memory device, which is capable of correctly reading data by preventing the disturbance phenomenon when a read or verification operation is performed.

A method of operating a nonvolatile memory device, including a memory cell array, which further includes a drain select transistor, a memory cell string, and a source select transistor coupled between a bit line and a source line, according to an aspect of the present disclosure includes precharging the bit line, setting the memory cell string in a ground voltage state, coupling the memory cell string and the bit line together and supplying a read voltage or a verification voltage to a selected memory cell of the memory cell string, and coupling the memory cell string and the source line together in order to change a voltage level of the bit line in response to a threshold voltage of the selected memory cell.

Setting the cell string in a ground voltage state may include discharging channel regions of memory cells included in the memory cell string. Further, discharging channel regions of the memory cells included in the memory cell string may include supplying a pass voltage to all of the memory cells, and coupling the channel regions and the source line together.

Discharging channel regions of the memory cells included in the memory cell string may include supplying a ground voltage to the source line, and turning on the source select transistor.

The bit line may be maintained in a precharge state by a page buffer until the memory cell string is coupled to the source line. Also, the bit line and the page buffer may be disconnected from each other when the memory cell string is coupled to the source line.

Supplying the read voltage or the verification voltage to the selected memory cell of the memory cell string may include supplying a ground voltage to the selected memory cell and supplying the read voltage or the verification voltage to a word line corresponding to the selected memory cell.

Supplying the read voltage or the verification voltage to the selected memory cell of the memory cell string may include supplying the selected memory cell with the read voltage or the verification voltage less than the pass voltage.

Precharging the bit line may include precharging a sense node to a high voltage level, and coupling the sense node and the bit line together by supplying a bit line selection signal to a bit line selection unit.

Alternatively, precharging the bit line may include precharging a sense node to a high voltage level, and coupling the sense node and the bit line together by supplying a bit line sense signal to a bit line sense unit.

Coupling the memory cell string and the bit line together and supplying the read voltage or the verification voltage to the selected memory cell of the memory cell string may include turning on the drain select transistor, and supplying the read voltage or the verification voltage to a word line corresponding to the selected memory cell.

After coupling the memory cell string and the source line together in order to change a voltage level of the bit line in response to a threshold voltage of the selected memory cell, the method may further include disconnecting the bit line and a sense node from each other; and discharging the memory cell string, and, at the same time, evaluating the voltage level of the bit line in response to the threshold voltage of the selected memory cell, and coupling the bit line and the sense node, which is in a floating state, and sensing a voltage level of the sense node in response to the evaluated voltage level of the bit line.

A method of operating a nonvolatile memory device according to another aspect of the present disclosure includes providing a memory cell array, comprising a drain select transistor, a memory cell string, and a source select transistor coupled between a bit line and a source line, precharging the bit line and supplying a ground voltage to the source line, turning on memory cells, included in the memory cell string, and the source select transistor, turning off the source select transistor, supplying a verification voltage or a read voltage to a selected memory cell from among the memory cells, and turning on the drain select transistor, and turning on the source select transistor in order to change a voltage level of the bit line in response to a threshold voltage of the selected memory cell.

The bit line may be maintained in a precharge state by a page buffer until turning on of the source select transistor in order to change the voltage level of the bit line in response to the threshold voltage of the selected memory cell. The bit line and the page buffer may be disconnected from each other at the same time as the turning on of the source select transistor in order to change the voltage level of the bit line in response to the threshold voltage of the selected memory cell.

Turning on the memory cells, included in the memory cell string, and the source select transistor may include supplying a pass voltage to all of the memory cells included in the memory cell string and turning on the source select transistor.

Supplying the verification voltage or the read voltage to the selected memory cell from among the memory cells may include supplying the ground voltage to the selected memory cell, and supplying the read voltage or the verification voltage to a word line corresponding to the selected memory cell.

Supplying the read voltage or the verification voltage to the selected memory cell from among the memory cells may include supplying the selected memory cell with the read voltage or the verification voltage, which is less than the pass voltage.

Precharging the bit line and supplying the ground voltage to the source line may include precharging a sense node to a high voltage level, coupling the sense node and the bit line together by supplying a bit line selection signal to a bit line selection unit, and supplying the ground voltage to the source line.

Alternatively, precharging the bit line and supplying the ground voltage to the source line may include precharging a sense node to a high voltage level, coupling the sense node and the bit line together by supplying a bit line sense signal to a bit line sense unit, and supplying the ground voltage to the source line.

After turning on the source select transistor in order to change the voltage level of the bit line in response to the threshold voltage of the selected memory cell, the method may further include disconnecting the bit line and a sense node from each other, and discharging the memory cell string, and, at the same time, evaluating the voltage level of the bit line in response to the threshold voltage of the selected memory cell, and coupling the bit line and the sense node, which is in a floating state, and sensing a voltage level of the sense node in response to the evaluated voltage level of the bit line.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
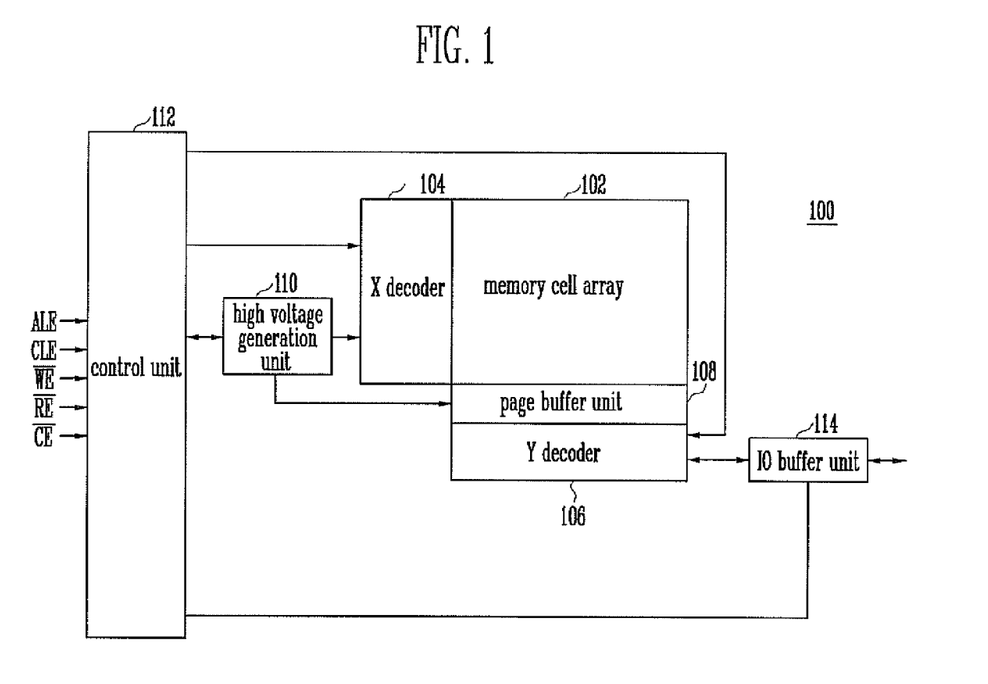
FIG. 1 is a block diagram showing the construction of a nonvolatile memory device according to an embodiment of the present disclosure.

FIG. 1 is a block diagram showing the construction of a nonvolatile memory device according to an embodiment of the present disclosure.

The nonvolatile memory device 100 includes a memory cell array 102, an X decoder 104, a Y decoder 106, a page buffer unit 108, a high voltage generation unit 110, a control unit 112, and an IO buffer unit 114.

The memory cell array 102 includes a number of memory cell blocks. For example, the memory cell array 102 can include 1,024 memory cell blocks.

The control unit 112 controls the overall operation of the nonvolatile memory device 100 and generates a program command signal, an erase command signal, a read command signal, and so on in response to signals transmitted and received via the IO buffer unit 114. For example, when a chip enable signal /CE for the control unit 112 is enabled and a write enable signal /WE therefor is toggled, the control unit 112 generates a program command, an erase command, or a read command in response to the command signal received via the IO buffer unit 114. Further, the control unit 112 transmits the command signal in response to a command latch enable signal CLE and transmits an address signal in response to an address latch enable signal ALE.

The high voltage generation unit 110 generates bias voltages in response to the program command, the erase command, or the read command generated by the control unit 112 and supplies them to the page buffer unit 108, the X decoder 104, etc.

The X decoder 104 supplies one of the memory cell blocks of the memory cell array 102 with the bias voltages, generated by the high voltage generation unit 110, in response to a row address signal generated by the control unit 112.

The Y decoder 106 supplies a data signal to the page buffer unit 108 in response to a column address signal generated by the control unit 112. Further, the Y decoder 106 functions to output data, stored in the page buffer unit 108, through the IO buffer unit 114 when a read operation is performed.

The page buffer unit 108 includes a plurality of page buffers. Each of the page buffers stores the data signal received from the IO buffer unit 114 via the Y decoder 106 and outputs the stored data signal to bit lines shared by the blocks of the memory cell array 102. Further, each page buffer stores data read from the memory cell array 102 and outputs the stored data externally through the Y decoder 106 and the IO buffer unit 114, when a read operation is performed.

Figure 2:
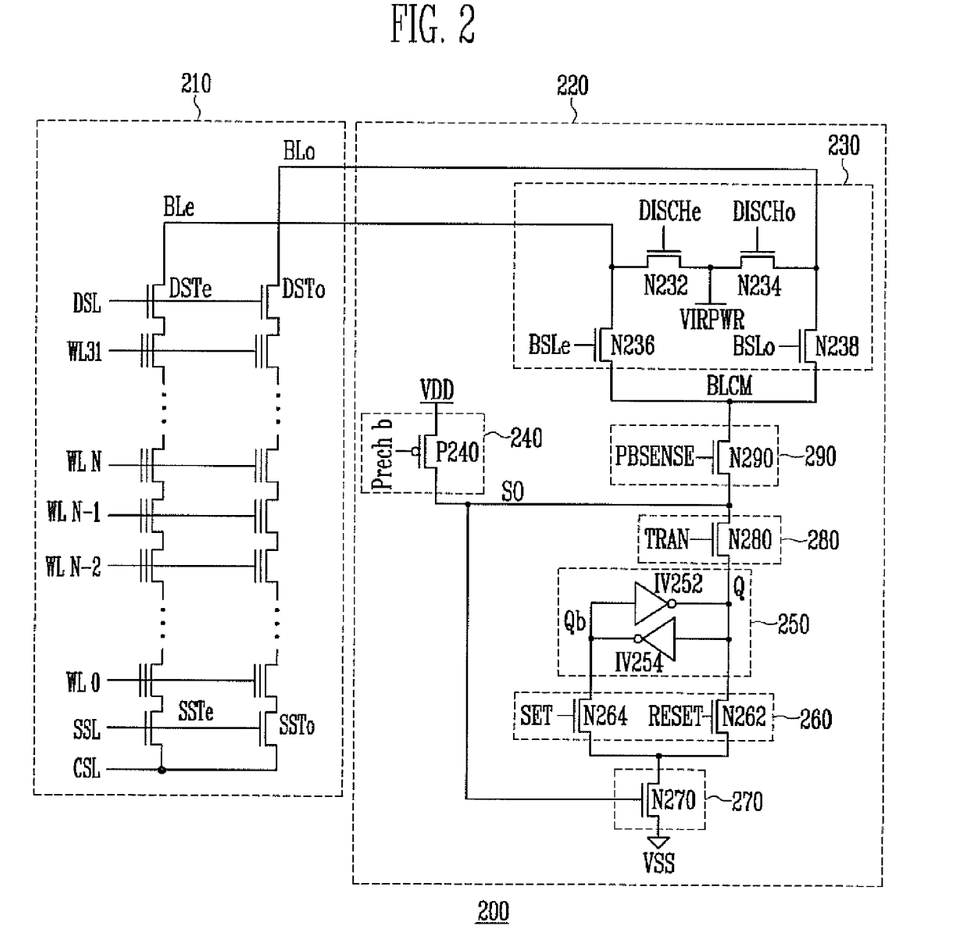
FIG. 2 is a circuit diagram illustrating a memory cell block and a page buffer of a nonvolatile memory device.

FIG. 2 is a diagram illustrating a memory cell block and a page buffer of a nonvolatile memory device.

The nonvolatile memory device 200 includes a memory cell block 210, configured to include a number of memory cells, and a page buffer 220, coupled to specific memory cells of the memory block 210 and configured to program data into the specific memory cells or to read data stored in the specific memory cells.

The memory cell block 210 includes memory cells for storing data, word lines WL<0:31> for selecting and enabling the memory cells, and bit lines BLe and BLo for inputting and outputting data to and from the memory cells. The memory cell block 210 includes drain select transistors DSTe, DSTo coupled between the bit lines BLe, BLo and the memory cells and source select transistors SSTe, SSTo coupled between a common source line CSL and the memory cells. Groups of the memory cells are coupled in series between the source select transistors SSTe, SSTo and the drain select transistors DSTe, DSTo. The group of memory cells is referred to as a cell string. The gates of the memory cells are coupled to the respective word lines. A group of the memory cells which are coupled to the same word line in common is referred to as a page. A plurality of the memory cell strings each coupled to the bit lines BLe or BLo are coupled to the common source line in parallel, thus forming the memory cell block 210.

The page buffer 220 includes a bit line selection unit 230, a sense node precharge unit 240, a data latch unit 250, a data set unit 260, a sense node sense unit 270, a data transfer unit 280, and a bit line sense unit 290. The bit line selection unit 230 selectively couples the bit line BLe or BLo, coupled to specific memory cells, and a sense node SO together. The sense node precharge unit 240 precharges the sense node SO to a power source voltage of a high voltage level. The data latch unit 250 temporarily stores data to be programmed into the specific memory cell or temporarily stores data read from the specific memory cell. The data set unit 260 inputs the data to the data latch unit 250. The sense node sense unit 270 supplies a ground voltage VSS to a specific node of the data latch unit 250 in response to a voltage level of the sense node SO. The data transfer unit 280 transfers the data, stored in the data latch unit 250, to the sense node SO. The bit line sense unit 290 transfers a voltage level of the bit line BLe or BLo to the sense node SO in response to a data state of the specific memory cell during a verification or read operation.

The bit line selection unit 230 includes an NMOS transistor N236 and an NMOS transistor N238. The NMOS transistor N236 couples the even bit line BLe and the sense node SO together in response to a first bit line selection signal BSLe. The NMOS transistor N238 couples the odd bit line BLo and the sense node SO together in response to a second bit line selection signal BSLo. The bit line selection unit 230 further includes a variable voltage terminal, an NMOS transistor N232, and an NMOS transistor N234. The variable voltage terminal supplies a variable voltage VIRPWR of a specific voltage level. The NMOS transistor N232 couples the even bit line BLe and the variable voltage together in response to a first discharge signal DISCHe. The NMOS transistor N234 couples the odd bit line BLo and the variable voltage terminal together in response to a second discharge signal DISCHo. In alternative embodiments, the bit line sense unit 290 may be omitted from the page buffer. In this case, the NMOS transistors N236 and N238 may play the role of the bit line sense unit 290.

The sense node precharge unit 240 supplies a high power source voltage VDD to the sense node SO in response to a precharge signal Prech b. To this end, the sense node precharge unit 240 includes a PMOS transistor P240 coupled between a power source voltage terminal for supplying the high power source voltage VDD and the sense node SO. The sense node precharge unit 240 supplies the high power source voltage to the sense node SO in response to the precharge signal Prech b of a low logic level.

The data latch unit 250 includes a first inverter IV252 and a second inverter IV254. The output terminal of the first inverter IV252 is coupled to the input terminal of the second inverter IV254, and the output terminal of the second inverter IV254 is coupled to the input terminal of the first inverter IV252. Here, a node at which the output terminal of the first inverter IV252 is coupled to the input terminal of the second inverter IV254 is referred to as a first node Q. A node at which the output terminal of the second inverter IV254 is coupled to the input terminal of the first inverter IV252 is referred to as a second node Qb.

The data set unit 260 includes a first data set transistor N262 and a second data set transistor N264. The first data set transistor N262 supplies the ground voltage VSS to the first node Q of the data latch unit 250. The second data set transistor N264 supplies the ground voltage VSS to the second node Qb of the data latch unit 250. The first data set transistor N262 is coupled between the sense node sense unit 270 and the first node Q of the data latch unit 250, and is configured to supply the first node Q with the ground voltage VSS, received from the sense node sense unit 270, in response to a first data set signal RESET. The second data set transistor N264 is coupled between the sense node sense unit 270 and the second node Qb of the data latch unit 250, and is configured to supply the second node Qb with the ground voltage VSS, received from the sense node sense unit 270, in response to a second data set signal SET.

The sense node sense unit 270 includes an NMOS transistor N270 coupled between the data set unit 260 and a ground voltage terminal for supplying the ground voltage VSS. The sense node sense unit 270 supplies the ground voltage VSS to the data set unit 260 in response to a voltage level of the sense node SO. Here, the sense node sense unit 270 supplies the ground voltage VSS to the data set unit 260 only when the sense node SO has a relatively high voltage level. If the first data set signal RESET of a high logic level is received, the ground voltage VSS is supplied to the first node Q of the data latch unit 250. In this case, it is said that data of a low logic level have been supplied to the first node Q of the data latch unit 250. However, if the second data set signal SET of a high logic level is received, the ground voltage VSS is supplied to the second node Qb of the data latch unit 250. In this case, it is said that data of a high logic level have been supplied to the first node Q of the data latch unit 250.

The data transfer unit 280 selectively transfers the data, stored in the first node Q of the data latch unit 250, to the sense node SO. To this end, the data transfer unit 280 includes a data transfer transistor N280 for selectively coupling the first node Q and the sense node SO together in response to a data transfer signal TRAN.

The bit line sense unit 290 includes an NMOS transistor N290 coupled between the bit line selection unit 230 and the sense node SO. The bit line sense unit 290 couples a common bit line node BLCM and the sense node SO together in response to a bit line sense signal PBSENSE of a high logic level, and evaluates the voltage level of a specific bit line, such that the data state of a specific memory cell is supplied to the sense node SO. Here, a first voltage V1 or a second voltage V2, less than the first voltage V1, is supplied as a voltage of a first or second bit line selection signal BSLe or BSLo. Then, a read or verification operation is performed in response to a voltage level of the bit line sense signal PBSENSE supplied to the gate of the NMOS transistor N290. As described above, the bit line sense unit 290 may be omitted from the page buffer. In this case, the NMOS transistors N236 and N238 may play the role of the bit line sense unit 290. In other words, the read or verification operation can be performed in response to the first or second bit line selection signal BSLe or BSLo having the first voltage V1 or the second voltage V2 (where, for example, the second voltage V2 is less than the first voltage V1).

It is to be noted that the page buffer 220 shown in FIG. 2 is only illustrative in order to describe various operations performed in the page buffer. It is evident to those skilled in the art that the page buffer 220 can be modified in various ways. For example, the page buffer 220 can be modified to include a number of the data latch units 250, as known in the art.

A read operation, a verification operation, etc. which are performed in the nonvolatile memory device are described below.

Figure 3:
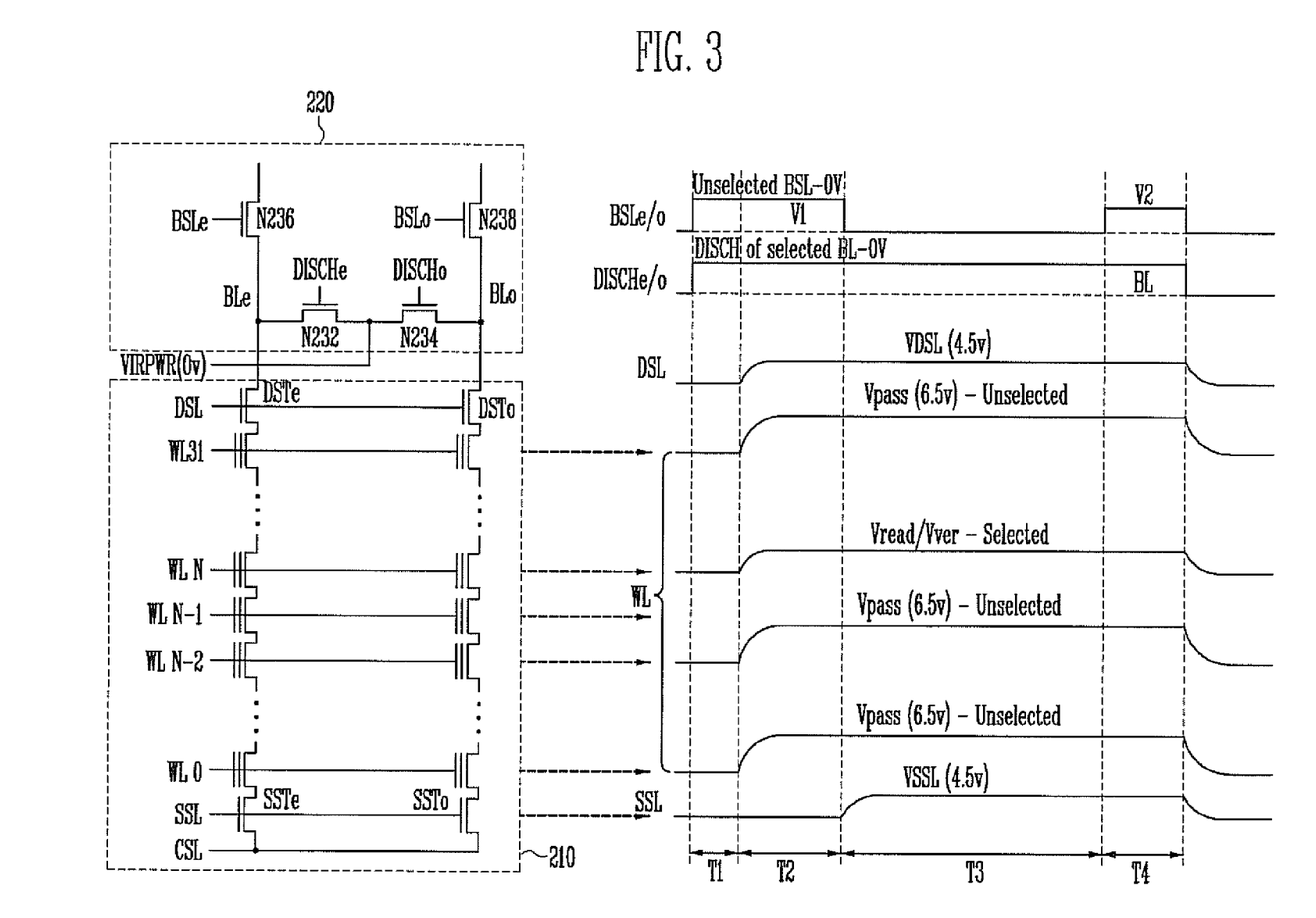
FIG. 3 is a diagram illustrating a verification operation or a read operation of the nonvolatile memory device.

FIG. 3 is a diagram illustrating the verification operation or the read operation performed by the nonvolatile memory device.

This figure illustrates a construction in which the bit line sense unit 290 is omitted from the page buffer 220 shown in FIG. 2. The read operation or the verification operation is performed by supplying the first or second bit line selection signal BSLe or BSLo having the first voltage V1 or the second voltage V2, where the second voltage V2 is less than the first voltage V1. In the case in which the bit line sense unit 290 is included the page buffer 220, the read operation or the verification operation can be performed by supplying the bit line sense signal PBSENSE having the first voltage V1 or the second voltage V2. However, here the bit line BLe or BLo to be read and verified is selected in response to the first or second bit line selection signal BSLe or BSLo.

In summary, in the case in which the bit line sense unit 290 is not included the page buffer 220, the bit line selection signals BSLe, BSLo are used to select the bit line, and also used as sense signals during the read or verification operation. However, in the case in which the bit line sense unit 290 is included in the page buffer 220, the bit line selection signals BSLe, BSLo is used to select the bit line, and the bit line sense signal PBSENSE is used as a sense signal during the read or verification operation.

(1) Period T1

First, the bit line BLo or BLe (i.e., a selected bit line) coupled to memory cells which will be read or verified (i.e., selected memory cells) is precharged to a high voltage level. To this end, the sense node precharge unit 240 is used to couple the sense node SO and the power source voltage terminal together. The bit line selection signal BSLe or BSLo having the first voltage V1 is supplied to the bit line selection unit 230, thereby precharging the selected bit line to a high voltage level approximately equal to V1-Vth (where Vth is the threshold voltage of the NMOS transistor N236 or N238). Here, the bit line select signal BSLe or BSLo of a low logic level is supplied to the NMOS transistor N236 or N238 coupled to an unselected bit line, so that the unselected bit line and the sense node SO having a high voltage level are disconnected from each other. Alternatively, in the case in which the bit line sense unit 290 is included in the page buffer, the bit line sense signal PBSENSE having the first voltage V1 can be used to precharge the selected bit line.

The discharge signal DISCHe or DISCHo having a high logic level is supplied to the NMOS transistor N232 or N234 coupled to the unselected bit line, so that the unselected bit line and the variable voltage terminal to which the ground voltage is supplied are connected to each other. In other words, the unselected bit line is maintained at a low voltage level. Here, the discharge signal DISCHe or DISCHo of a low logic level is supplied to the NMOS transistor N232 or N234 coupled to the selected bit line, so that the selected bit line and the variable voltage terminal are disconnected from each other.

Typically, the read or verification operation is performed on memory cells coupled to the even bit lines BLe and memory cells coupled to the odd bit lines BLo separately. Thus, in the case in which the read or verification operation is performed on the memory cells coupled to the even bit lines, only the even bit lines are precharged to a high voltage level, and the odd bit lines are discharged to a low voltage level. On the contrary, in the case in which the read or verification operation is performed on the memory cells coupled to the odd bit lines, only the odd bit lines are precharged to a high voltage level, and the even bit lines are discharged to a low voltage level.

(2) Period T2

Next, the selected bit line precharged to a high voltage level is coupled to a cell string including the selected memory cells. To this end, the drain select transistor DSTe or DSTo is turned on by supplying the drain selection signal DSL of a high logic level, thereby coupling the selected bit line and the memory cell string together. Here, a read or verification reference voltage Vread or Vver or a pass voltage Vpass is supplied to each of the word lines depending on whether the word line is to be read or verified. That is, the read or verification reference voltage Vread or Vver (i.e., a reference voltage for the read or verification operation) is supplied to a word line coupled to the selected memory cell, and the pass voltage Vpass is supplied to the remaining word lines, so that the corresponding memory cells are all turned on irrespective of their data state.

Accordingly, all the unselected memory cells are turned on, and whether the selected memory cells will be turned on is determined according to their threshold voltages.

(3) Period T3

The supply of the bit line selection signal BSLe or BSLo or the bit line sense signal PBSENSE, having the first voltage V1, is stopped, and a voltage level of the selected bit line is changed according to a data state of the selected memory cells. When the supply of the bit line selection signal BSLe or BSLo or the bit line sense signal PBSENSE is stopped, the selected bit line and the sense node SO coupled to the power source voltage terminal are disconnected from each other. Thus, the selected bit line enters a floating state. At this time, the source select transistors SSTe, SSTo are turned on by supplying the source selection signal SSL, thereby coupling the corresponding cell strings and the common source line CSL together.

If a threshold voltage of the selected memory cell is less than the read or verification reference voltage Vread or Vver, the selected memory cell is turned on, and so the selected bit line is discharged to a low voltage level. Thus, the unselected memory cells have already been turned on in response to the pass voltage Vpass, and the selected memory cell is also turned on. Accordingly, the selected bit line is discharged to a low voltage level through the grounded common source line CSL.

On the other hand, if a threshold voltage of the selected memory cell is the read reference voltage Vread or verification reference voltage Vver or more, the selected memory cell is turned off, and so the selected bit line is maintained at a high voltage level. That is, since the selected memory cell is turned off, the selected bit line is maintained at a high voltage level because a current path to the common source line is prevented from being formed.

(4) Period T4

Next, the bit line selection signal BSLe or BSLo or the bit line sense signal PBSENSE, having the second voltage V2, is supplied so that a data state of the selected memory cell is stored in the data latch unit 250.

In the period T3, if the selected memory cell is programmed with a threshold voltage having the reference voltage or more, the selected bit line is maintained at the precharged voltage level of approximately V1-Vth. If the selected memory cell is programmed with a threshold voltage less than the reference voltage, the voltage level of the selected bit line shifts to a low voltage level.

In the case in which the bit line selection signal BSLe or BSLo or the bit line sense signal PBSENSE, having the second voltage V2, less than the first voltage V1, is supplied, whether the NMOS transistor N236, N238, or N290 to which the corresponding signal is supplied will be turned on is determined according to a voltage level of the selected bit line. Although not shown, prior to the start of the fourth period T4, the operation of the sense node precharge unit 240 is stopped, so that the sense node SO is in a floating state.

If the voltage level of the selected bit line shifts to a low voltage level because the selected memory cell has not been programmed with a threshold voltage having the reference voltage or more, the NMOS transistor N236, N238, or N290 is turned on in response to the bit line selection signal BSLe or BSLo or the bit line sense signal PBSENSE having the second voltage V2. Thus, in this case, the sense node SO in a floating state shifts to a ground voltage state through the grounded common source line CSL.

However, if the selected bit line is maintained in a high voltage level because the selected memory cell has been programmed with a threshold voltage having the reference voltage or more, the NMOS transistor N236, N238, or N290 is turned off despite the supply of the second voltage V2. Thus, in this case, the sense node SO in a floating state maintains a high voltage level.

In more detail, referring to FIG. 2, if the sense node SO shifts to a ground voltage state because the selected memory cell has not been programmed with a threshold voltage having the reference voltage or more, the sense node sense unit 270 is not operated.

However, if the sense node SO maintains a high voltage level because the selected memory cell has been programmed with a threshold voltage having the reference voltage or more, the sense node sense unit 270 is operated to supply the ground voltage to the data set unit 260. Accordingly, a state of data stored in the first node Q can be changed.

Figure 4:
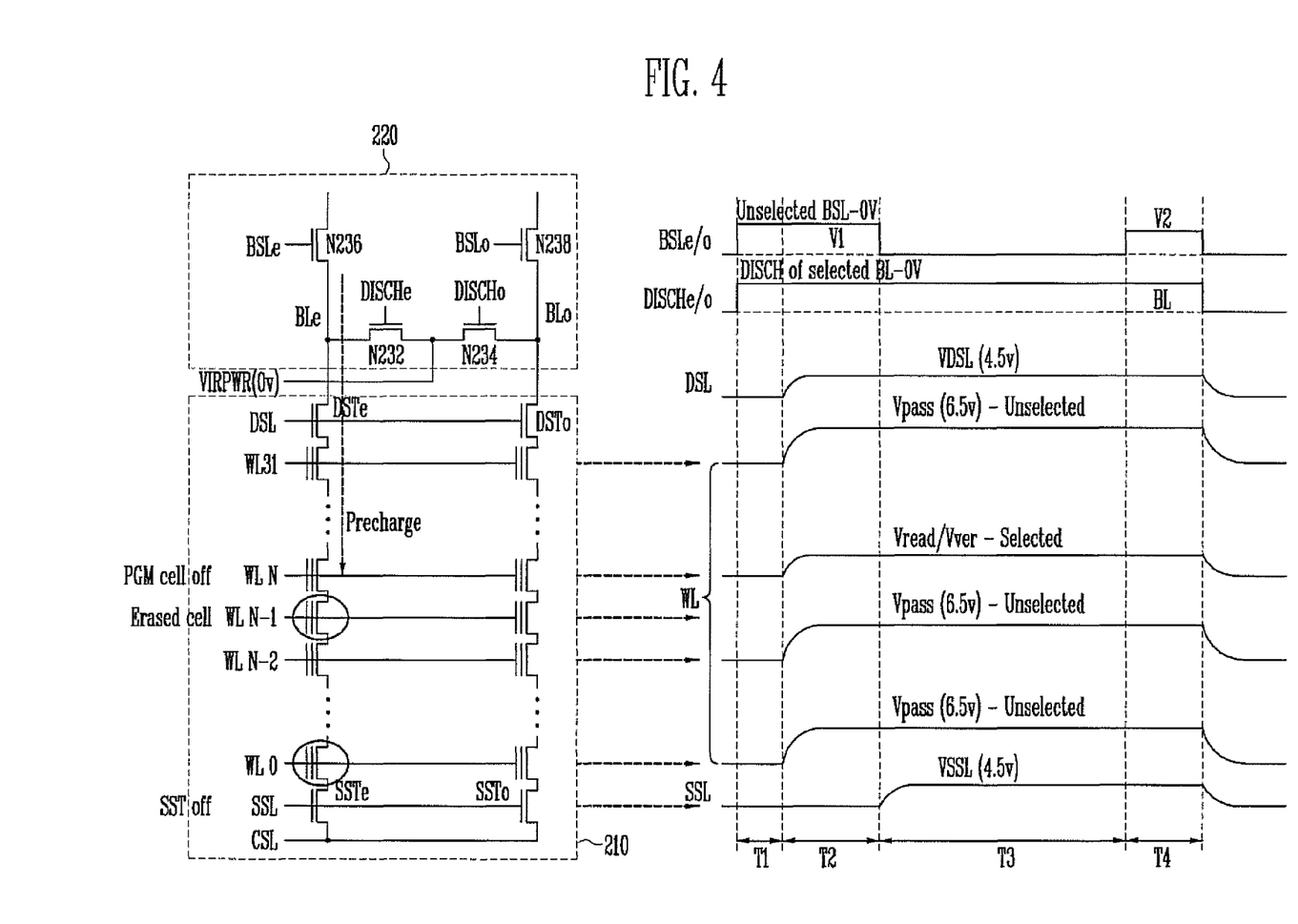
FIG. 4 is a diagram illustrating phenomena occurring during the read or verification operation of the nonvolatile memory device.

FIG. 4 is a diagram illustrating phenomena occurring during the read or verification operation of the nonvolatile memory device.

In FIG. 4, it is assumed that the even bit line BLe (i.e., a selected bit line) is coupled to memory cells to be read or verified (i.e., selected memory cells). Thus, in a period T1, the even bit line BLe is precharged to a high voltage level, and the odd bit line BLo is grounded.

In a period T2, the selected bit line and a cell string, including the selected memory cells, are coupled together, and the reference voltage Vread, Vver or the pass voltage Vpass is supplied to each of the word lines. Therefore, either the reference voltage Vread, Vver or the pass voltage Vpass is supplied to each of the memory cells coupled to the selected bit line BSLe. More specifically, the reference voltage Vread, Vver is supplied to a word line coupled to the selected memory cell, and the pass voltage Vpass is supplied to the remaining word lines. If the selected memory cell is a programmed memory cell, the memory cell is turned off. Thus, a floating channel is formed between the word line closest to the common source line CSL (for example, the word line WL0 in FIG. 4) and the word line prior to the selected memory cell (for example, the word line WL N−1 in FIG. 4, where N is a positive integer used to denote which one of the memory cells is selected). In this case, an HCI phenomenon resulting from a strong electric field can be generated in memory cells close to both ends of the floating channel, and so charges are trapped at the floating gates of the corresponding memory cells. Accordingly, the disturbance phenomenon, characterized by a rise in the threshold voltage of the corresponding memory cells, can occur.

Likewise, the reference voltage Vread, Vver or the pass voltage Vpass is supplied to the memory cells coupled to the unselected bit line. Whether a memory cell from among the memory cells coupled to the unselected bit line to which the reference voltage Vread, Vver is supplied will be turned on is determined in response to a threshold voltage of the corresponding memory cell. That is, if a memory cell, coupled to the unselected bit line and supplied with the read or verification reference voltage Vread, Vver, has a threshold voltage less than the reference voltage, the memory cell is turned on. However, if a memory cell, coupled to the unselected bit line and supplied with the read or verification reference voltage Vread, Vver, has a threshold voltage having the reference voltage or more, the memory cell is turned off and a channel is formed on the basis of the memory cell. Accordingly, threshold voltages of the memory cells are likely to rise because of voltage supplied to the gates of the memory cells.

In other words, charges can move to the floating gates of the memory cells because a high pass voltage is supplied to the gates of the memory cells. As a result, an HCI phenomenon may occur, leading to a disturbance phenomenon in which threshold voltages of the memory cells rise.

Such a disturbance phenomenon is likely to occur when higher voltage is supplied to the gates of the memory cells. More specifically, with an increase in the amount of charges existing in the channel, charges trapped at the floating gates of the memory cells are increased, which results in a higher possibility of disturbance phenomenon. To prevent the above phenomenon, the present disclosure proposes a method of operating a nonvolatile memory device that discharges charges existing in a channel when a read or verification operation is performed.

Figure 5:
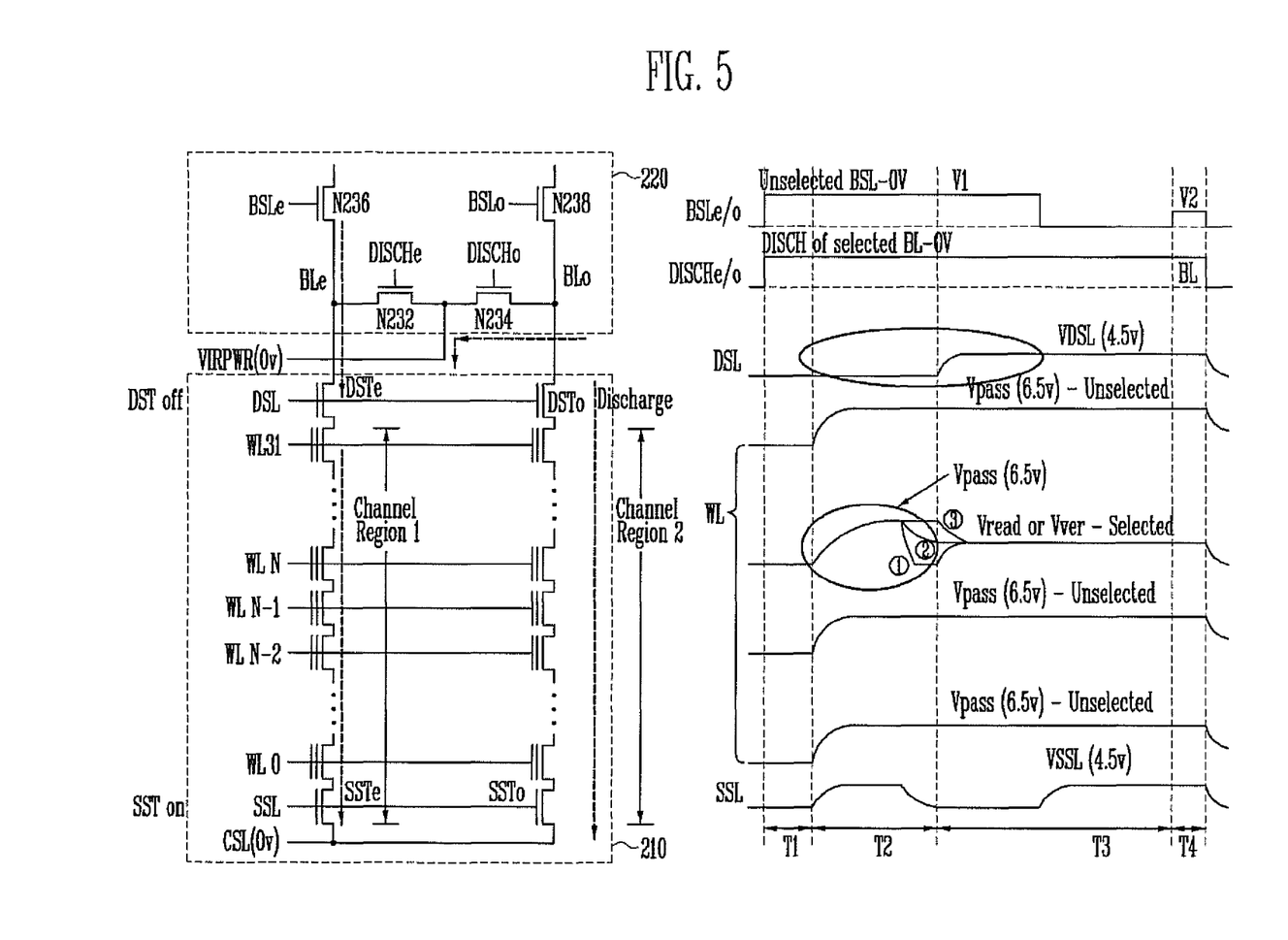
FIG. 5 is a diagram illustrating a verification operation or a read operation of the nonvolatile memory device according to an embodiment of the present disclosure.

FIG. 5 is a diagram illustrating a verification operation or a read operation of the nonvolatile memory device according to an embodiment of the present disclosure.

In the embodiment of the present disclosure, when a read or verification operation is performed, charges existing in a channel are discharged in order to prevent the disturbance phenomenon from occurring. To this end, a new method of supplying voltage to the drain select line DSL and supplying the pass voltage Vpass and the reference voltage Vread, Vver to the word lines is proposed.

Referring to FIG. 5, the verification operation or the read operation can be classified into a first period T1, a second period T2, a third period T3, and a fourth period T4. In the first period T1, a bit line is precharged. In the second period T2, a cell string is set to a ground voltage state. In the third period T3, data of a memory cell which will be read or verified are evaluated. In the fourth period T4, data of the selected memory cells is sensed. Each of the periods is described in more detail below.

(1) Period T1

First, the bit line BLo or BLe (i.e., a selected bit line) coupled to memory cells which will be read or verified (i.e., selected memory cells) is precharged to a high voltage level. To this end, the sense node precharge unit 240 is used to couple the sense node SO and the power source voltage terminal together. The bit line selection signal BSLe or BSLo having the first voltage V1 is supplied to the bit line selection unit 230, thereby precharging the selected bit line to a high voltage level approximately equal to V1-Vth (where Vth is the threshold voltage of the NMOS transistor N236 or N238). Here, the bit line select signal BSLe or BSLo of a low logic level is supplied to the NMOS transistor N236 or N238 coupled to an unselected bit line, so that the unselected bit line and the sense node SO having a high voltage level are disconnected from each other. Alternatively, in the case in which the bit line sense unit 290 is included in the page buffer, the bit line sense signal PBSENSE having the first voltage V1 can be used to precharge the selected bit line.

The discharge signal DISCHe or DISCHo having a high logic level is supplied to the NMOS transistor N232 or N234 coupled to the unselected bit line, so that the unselected bit line and the variable voltage terminal to which the ground voltage is supplied are connected to each other. In other words, the unselected bit line is maintained at a low voltage level. Here, the discharge signal DISCHe or DISCHo of a low logic level is supplied to the NMOS transistor N232 or N234 coupled to the selected bit line, so that the selected bit line and the variable voltage terminal are disconnected from each other.

Typically, the read or verification operation is performed on memory cells coupled to the even bit lines BLe and memory cells coupled to the odd bit lines BLo separately. Thus, in the case in which the read or verification operation is performed on the memory cells coupled to the even bit lines, only the even bit lines are precharged to a high voltage level, and the odd bit lines are discharged to a low voltage level. On the contrary, in the case in which the read or verification operation is performed on the memory cells coupled to the odd bit lines, only the odd bit lines are precharged to a high voltage level, and the even bit lines are discharged to a low voltage level.

(2) Period T2

At first, the drain select transistors DSTe, DSTo are turned off by supplying voltage of a low logic level to the drain select line DSL, thereby disconnecting the selected bit line and a cell string, including the selected memory cells, from each other. In this case, as can be seen from FIG. 5, a first region and a second region are formed in the memory cell strings. Next, the same pass voltage Vpass is supplied to all the word lines. That is, all the memory cells are turned on by supplying the pass voltage Vpass to the word lines coupled to the selected memory cells. Next, the source select transistors SSTe, SSTo are turned on so that the memory cell string is coupled to the common source line CSL of a ground voltage state. In this case, the first regions and the second regions of the memory cells, included in the memory cell strings, are discharged.

It is to be noted that the voltage level of the pass voltage Vpass is not limited to 6.5 V. The pass voltage Vpass higher than the threshold voltage of a memory cell, expected to have the highest threshold voltage, is supplied to all the word lines. In a single level cell (SLC) program method or a multi-level cell (MLC) program method, two or more different distributions of a threshold voltage are generated. The pass voltage Vpass higher than the threshold voltage of a memory cell, expected to have the highest threshold voltage in each distribution, is supplied to all the word lines, so that the memory cells coupled to the word lines are turned on irrespective of a data state of the memory cells.

Meanwhile, the operation performed in the period T2 is performed on the memory cells coupled to the unselected bit lines and the memory cells coupled to the selected bit lines at the same time. Further, in this second period T2, the selected bit line is maintained at a high voltage level supplied through the sense node SO. Thus, although all the memory cells are turned on by supplying the pass voltage Vpass, the selected bit line is maintained at a high voltage level in the period T2.

Next, the pass voltage Vpass supplied to a selected word line (e.g., WL N) coupled to the selected memory cells is discharged, and the reference voltage Vread or Vver is supplied to the selected word line WL N. Further, the supply of the drain selection signal DSL is stopped, thereby disconnecting the selected bit line and the memory cell string from each other.

The method of supplying the reference voltage Vread or Vver to the selected word line WL N in the period T2 can include the following three methods.

In the first method, the ground voltage is supplied to the selected word line WL N, and the reference voltage Vread or Vver is supplied subsequently to the selected word line WL N (see trace labeled as '1' in FIG. 5).

In the second method, the pass voltage Vpass supplied to the selected word line WL N is gradually lowered until it equals the reference voltage Vread or Vver (see trace labeled as '2' in FIG. 5).

In the third method, the pass voltage Vpass supplied to the selected word line WL N is maintained without change and then suddenly decreased to the reference voltage Vread or Vver (see trace labeled as '3' in FIG. 5).

It is to be noted that the three kinds of the methods are only illustrative, and thus, the method of supplying the reference voltage Vread or Vver to the selected word line WL N may vary.

Next, the source select transistors SSTe, SSTo are turned off by supplying the ground voltage to the source selection line SSL. Thus, the memory cell string and the common source line CSL are disconnected from each other. Accordingly, discharging of the first region and the second region is stopped.

(3) Period T3

First, the drain select transistors DSTe, DSTo are turned on by supplying a high level voltage to the drain select line DSL, thereby connecting the selected bit line and the memory cell string to each other. Here, the read reference voltage Vread or the verification reference voltage Vver is supplied to the word line WL N coupled to the selected memory cells, and the pass voltage Vpass is supplied to the unselected word lines coupled to the unselected memory cells.

As described above, there is a period in which the pass voltage Vpass is supplied to all the word lines prior to a period in which the pass voltage Vpass or the reference voltage Vread, Vver is supplied to each of the word lines. Accordingly, the disturbance phenomenon occurring during the read or verification operation can be minimized.

Eventually in the third period T3, the supply of the bit line selection signal BSLe or BSLo or the bit line sense signal PBSENSE, having the first voltage V1, is stopped, and a voltage level of the selected bit line is changed according to a data state of the selected memory cells. When the supply of the bit line selection signal BSLe or BSLo or the bit line sense signal PBSENSE is stopped, the selected bit line and the sense node SO coupled to the power source voltage terminal are disconnected from each other. Thus, the selected bit line enters a floating state. At this time, the source select transistors SSTe, SSTo are turned on by supplying the source selection signal SSL, and so the memory cell strings and the common source line CSL are coupled together.

If a threshold voltage of the selected memory cell is less than the read or verification reference voltage Vread or Vver, the selected memory cell is turned on, and so the selected bit line is discharged to a low voltage level. Thus, the unselected memory cells have already been turned on in response to the pass voltage Vpass, and the selected memory cell is also turned on. Accordingly, the selected bit line is discharged to a low voltage level through the grounded common source line CSL.

On the other hand, if a threshold voltage of the selected memory cell is the read or verification reference voltage Vread or Vver or more, the selected memory cell is turned off, and so the selected bit line is maintained at a high voltage level. That is, since the selected memory cell is turned off, the selected bit line is maintained at a high voltage level because a current path to the common source line is prevented from being formed.

(4) Period T4

Next, the bit line selection signal BSLe or BSLo or the bit line sense signal PBSENSE, having the second voltage V2, is supplied so that a data state of the selected memory cell is stored in the data latch unit 250.

In the period T3, if the selected memory cell is programmed with a threshold voltage having the reference voltage or more, the selected bit line is maintained at the precharged voltage level of approximately V1-Vth. If the selected memory cell is programmed with a threshold voltage less than the reference voltage, the voltage level of the selected bit line shifts to a low voltage level.

In the case in which the bit line selection signal BSLe or BSLo or the bit line sense signal PBSENSE, having the second voltage V2, less than the first voltage V1, is supplied, whether the NMOS transistor N236, N238, or N290 to which the corresponding signal is supplied will be turned on is determined according to a voltage level of the selected bit line. Although not shown, prior to the start of the fourth period T4, the operation of the sense node precharge unit 240 is stopped, so that the sense node SO is in a floating state.

If the voltage level of the selected bit line shifts to a low voltage level because the selected memory cell has not been programmed with a threshold voltage having the reference voltage or more, the NMOS transistor N236, N238, or N290 is turned on in response to the bit line selection signal BSLe or BSLo or the bit line sense signal PBSENSE having the second voltage V2. Thus, in this case, the sense node SO in a floating state shifts to a ground voltage state through the grounded common source line CSL.

However, if the selected bit line is maintained in a high voltage level because the selected memory cell has been programmed with a threshold voltage having the reference voltage or more, the NMOS transistor N236, N238, or N290 is turned off despite the supply of the second voltage V2. Thus, in this case, the sense node SO in a floating state maintains a high voltage level.

In more detail, referring to FIG. 2, if the sense node SO shifts to a ground voltage state because the selected memory cell has not been programmed with a threshold voltage having the reference voltage or more, the sense node sense unit 270 is not operated.

However, if the sense node SO maintains a high voltage level because the selected memory cell has been programmed with a threshold voltage having the reference voltage or more, the sense node sense unit 270 is operated to supply the ground voltage to the data set unit 260. Accordingly, a state of data stored in the first node Q can be changed.

According to the present disclosure, when a read operation or a verification operation is performed on a nonvolatile memory device, channel regions are discharged. Accordingly, there is an advantage in that the occurrence of the disturbance phenomenon can be reduced. Further, problems, such as under-programming and over-programming, can be prevented because data can be accurately read when the read operation or the verification operation is performed.

What is claimed is:

1. A method of operating a nonvolatile memory device, including a memory cell array, which includes a drain select transistor, a memory cell string, and a source select transistor coupled between a bit line and a source line, the method comprising:
   precharging the bit line;
   setting the memory cell string in a ground voltage state;
   coupling the memory cell string and the bit line together and supplying a read voltage or a verification voltage to a selected memory cell of the memory cell string; and
   coupling the memory cell string and the source line together in order to change a voltage level of the bit line in response to a threshold voltage of the selected memory cell.

2. The method of claim 1, wherein setting the memory cell string in a ground voltage state comprises discharging channel regions of memory cells included in the memory cell string.

3. The method of claim 2, wherein discharging channel regions of the memory cells included in the memory cell string comprises:
   supplying a pass voltage to all of the memory cells; and
   coupling the channel regions and the source line together.

4. The method of claim 2, wherein discharging channel regions of the memory cells included in the memory cell string comprises:
   supplying a ground voltage to the source line; and
   turning on the source select transistor.

5. The method of claim 1, wherein:
   the bit line is maintained in a precharge state by a page buffer until the memory cell string is coupled to the source line, and
   the bit line and the page buffer are disconnected from each other when the memory cell string is coupled to the source line.

6. The method of claim 1, wherein supplying the read voltage or the verification voltage to the selected memory cell of the memory cell string comprises:
   supplying a ground voltage to the selected memory cell; and
   supplying the read voltage or the verification voltage to a word line corresponding to the selected memory cell.

7. The method of claim 3, wherein the read voltage or the verification voltage is less than the pass voltage.

8. The method of claim 1, wherein precharging the bit line comprises:
   precharging a sense node to a high voltage level; and
   coupling the sense node and the bit line together by supplying a bit line selection signal to a bit line selection unit.

9. The method of claim 1, wherein precharging the bit line comprises:
   precharging a sense node to a high voltage level; and
   coupling the sense node and the bit line together by supplying a bit line sense signal to a bit line sense unit.

10. The method of claim 1, wherein coupling the memory cell string and the bit line together and supplying the read voltage or the verification voltage to the selected memory cell of the memory cell string comprises:

turning on the drain select transistor; and supplying the read voltage or the verification voltage to a word line corresponding to the selected memory cell.

11. The method of claim 1, further comprising:

after coupling the memory cell string and the source line together, disconnecting the bit line and a sense node from each other, and discharging the memory cell string, and, at the same time, evaluating the voltage level of the bit line in response to the threshold voltage of the selected memory cell; and coupling the bit line and the sense node, which is in a floating state, and sensing a voltage level of the sense node in response to the evaluated voltage level of the bit line.

12. A method of operating a nonvolatile memory device, including a memory cell array, which includes a drain select transistor, a memory cell string, and a source select transistor coupled between a bit line and a source line, the method comprising:

precharging the bit line and supplying a ground voltage to the source line;

turning on memory cells, included in the memory cell string, and the source select transistor;

turning off the source select transistor, supplying a verification voltage or a read voltage to a selected memory cell from among the memory cells, and turning on the drain select transistor; and turning on the source select transistor in order to change a voltage level of the bit line in response to a threshold voltage of the selected memory cell.

13. The method of claim 12, wherein:

the bit line is maintained in a precharge state by a page buffer until the turning on of the source select transistor in order to change the voltage level of the bit line in response to the threshold voltage of the selected memory cell, and the bit line and the page buffer are disconnected from each other at the same time as the turning on of the source select transistor in order to change the voltage level of the bit line in response to the threshold voltage of the selected memory cell.

14. The method of claim 12, wherein turning on the memory cells, included in the memory cell string, and the source select transistor comprises:

supplying a pass voltage to all of the memory cells included in the memory cell string; and turning on the source select transistor.

15. The method of claim 12, wherein supplying the verification voltage or the read voltage to the selected memory cell from among the memory cells comprises:

supplying the ground voltage to the selected memory cell; and supplying the read voltage or the verification voltage to a word line corresponding to the selected memory cell.

16. The method of claim 14, wherein the read voltage or the verification voltage is less than the pass voltage.

17. The method of claim 12, wherein precharging the bit line and supplying the ground voltage to the source line comprises:

precharging a sense node to a high voltage level;

coupling the sense node and the bit line together by supplying a bit line selection signal to a bit line selection unit; and supplying the ground voltage to the source line.

18. The method of claim 12, wherein precharging the bit line and supplying the ground voltage to the source line comprises:

precharging a sense node to a high voltage level;

coupling the sense node and the bit line together by supplying a bit line sense signal to a bit line sense unit; and supplying the ground voltage to the source line.

19. The method of claim 12, further comprising:

after turning on the source select transistor in order to change the voltage level of the bit line in response to the threshold voltage of the selected memory cell, disconnecting the bit line and a sense node from each other, and discharging the memory cell string, and, at the same time, evaluating the voltage level of the bit line in response to the threshold voltage of the selected memory cell; and coupling the bit line and the sense node, which is in a floating state, and sensing a voltage level of the sense node in response to the evaluated voltage level of the bit line.

* * * * *